(12) United States Patent
Chen

(10) Patent No.: US 10,490,626 B1
(45) Date of Patent: Nov. 26, 2019

(54) SEMICONDUCTOR DEVICE WITH SUPER JUNCTION AND PROCESS FOR THE SAME

(71) Applicant: PFC Device Holdings Limited, Hong Kong (HK)

(72) Inventor: Kuan-Yu Chen, New Taipei (TW)

(73) Assignee: PFC DEVICE HOLDINGS LIMITED, Chai Wan (HK)

( * ) Notice: Subject to any disclaimer, the term of this patent is extended or adjusted under 35 U.S.C. 154(b) by 0 days.

(21) Appl. No.: 16/048,628

(22) Filed: Jul. 30, 2018

(30) Foreign Application Priority Data

May 18, 2018 (TW) .............................. 107117067 A

(51) Int. Cl.

| | | |
|---|---|---|
| *H01L 29/06* | (2006.01) | |
| *H01L 21/265* | (2006.01) | |
| *H01L 29/10* | (2006.01) | |
| *H01L 29/167* | (2006.01) | |
| *H01L 29/08* | (2006.01) | |
| *H01L 21/266* | (2006.01) | |
| *H01L 21/20* | (2006.01) | |
| *H01L 29/66* | (2006.01) | |

(52) U.S. Cl.
CPC .......... *H01L 29/0634* (2013.01); *H01L 21/20* (2013.01); *H01L 21/266* (2013.01); *H01L 21/26506* (2013.01); *H01L 21/26513* (2013.01); *H01L 29/0623* (2013.01); *H01L 29/0684* (2013.01); *H01L 29/0847* (2013.01); *H01L 29/1095* (2013.01); *H01L 29/167* (2013.01); *H01L 29/66712* (2013.01)

(58) Field of Classification Search
CPC ............... H01L 21/20; H01L 21/26506; H01L 21/26513; H01L 21/266; H01L 29/0634; H01L 29/1095; H01L 29/167; H01L 29/66712; H01L 29/7802; H01L 29/7827
See application file for complete search history.

(56) References Cited

U.S. PATENT DOCUMENTS

| | | |
|---|---|---|
| 5,216,275 A | 6/1993 | Chen |
| 6,608,350 B2 | 8/2003 | Kinzer |
| 2008/0290442 A1 | 11/2008 | Hsieh et al. |
| 2018/0061936 A1* | 3/2018 | Tatemichi ............. H01L 21/265 |

* cited by examiner

*Primary Examiner* — Robert G Bachner
*Assistant Examiner* — Molly K Reida
(74) *Attorney, Agent, or Firm* — Muncy, Geissler, Olds & Lowe, P.C.

(57) ABSTRACT

A semiconductor device with super junction and process for the same is disclosed. The semiconductor device includes a silicon substrate and a first conductive type epitaxial layer thereon, a plurality of second conductive type conductive pillars formed below an upper face of the first conductive type epitaxial layer, where the second conductive type conductive pillars are implanted with neutral element having predetermined amount. When the semiconductor device operates in a predetermined temperature, the releasing amount of the neutral element can completely or partially compensate the releasing amount of carrier of opposite polarity from the epitaxial layer for the second conductive type conductive pillars due to the predetermined temperature, thus prevent the degrade of endurance ability for the surge voltage.

7 Claims, 5 Drawing Sheets

SEMICONDUCTOR DEVICE WITH SUPER JUNCTION AND PROCESS FOR THE SAME

BACKGROUND OF THE INVENTION

Field of the Invention

The present invention relates to a semiconductor device and process for the same, especially to a semiconductor device with super junction and process for the same.

Description of Prior Art

Since the first introduction by Dr. Chen in 1991, super junction devices are under substantive research for improved performance.

For example, U.S. Pat. No. 6,608,350 was disclosed with a trench type super junction device. FIG. 6 shows the sectional view of the trench type super junction device in U.S. Pat. No. 6,608,350. The trench type super junction MOS device comprises a substrate 81, an N type epitaxial layer 82, a plurality of parallel trenches 83, P type layer 84 on sidewall of each trench 83, P base 93 on the N type epitaxial layer 82, gate oxide layer 87 and gate 88 between two adjacent trenches 83 and atop the N type epitaxial layer 82, source 89 and source electrode 91 atop the P base 93, and dielectric layer (not labeled) in the P type layer 84. In conductive mode, a bias is applied to the gate 88 and the source 89 is grounded. A channel is formed between the P base 93 and the gate oxide layer 87 and current is generated when bias is applied to drain of this device. The P type layer 84 on sidewall of each trench 83 can provide lower on-resistance RDSON. In conventional MOS device, the resistivity of the N type epitaxial layer 82 should be lower (the doping concentration should be higher) to reduce on resistance RDSON. However, the voltage tolerance is affected when the doping concentration of the N type epitaxial layer 82 increases. The above-mentioned super junction structure can provide the advantage of both high voltage tolerance and lower on resistance.

However, with reference to FIG. 1, which shows the relationship between the breakdown voltage of the power semiconductor and the doping concentration offset, where the ordinate BVdss (V) shows the reverse bias voltage while the abscissa shows the doping concentration offset. At room temperature, the conventional super junction device (such as the super junction device shown in FIG. 6) is operated at point P1. As the temperature of the super junction device rises, the N− epitaxial layer will release electron with higher releasing rate and higher amount, while P type layer 84 will release hole with lower releasing rate and lower amount. As a result, the operation point will move leftward from the original point P1 (for example, move toward the point P2) and the surge voltage tolerance of the super junction device will be inferior.

SUMMARY OF THE INVENTION

It is an object of the present invention to provide a semiconductor device with super junction to overcome the inferior tolerance for surge voltage when operating in high temperature and to provide a process for the same.

Accordingly, the present invention provides a process for manufacturing a semiconductor device with super junction. The process comprises: (a) providing a silicon substrate; (b) forming a first conductive type epitaxial layer on the silicon substrate; (c) forming a mask layer on the first conductive type epitaxial layer; (d) implanting a second conductive type ions and neutral elements in a part of the first conductive type epitaxial layer not covered by the mask layer; (e) removing the mask layer; (f) repeating the steps (b) to (e) for a predetermined times to form a plurality of first conductive type epitaxial layers, wherein the first conductive type epitaxial layers have second conductive type ions and neutral elements.

Accordingly, the present invention provides a semiconductor device with super junction, comprising: a silicon substrate; a first conductive type epitaxial layer formed on the silicon substrate; a plurality of second conductive type columns formed below an upper face of the first conductive type epitaxial layer; wherein at least part of the second conductive type columns have implanted neutral elements.

The semiconductor device with super junction may be super junction MOSFET, super junction MESFET, super junction Schottky transistor, super junction IGBT, or super junction diode.

In the semiconductor device with super junction according to the present invention, at least one of the P type columns 20 is implanted with the neutral element N. The released holes from the neutral element N can counteract or at least partially counteract the additionally released electrons from the lightly-doped N type epitaxial layer 110 (in which the P type dopant resides) due to the rise of operating temperature of the super junction device. Therefore, the tolerance of the semiconductor device for surge voltage can be kept from being inferior.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

The detailed description of the present invention will be described in detail below with reference to the attached drawings.

Figure 2:
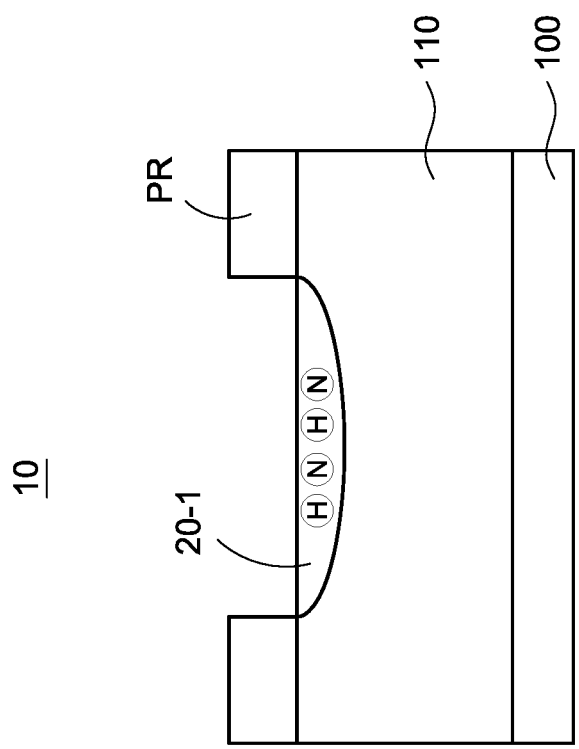
FIGS. 2 to 4 show the process for manufacturing the semiconductor device with super junction according to an embodiment of the present invention.
Figure 3:
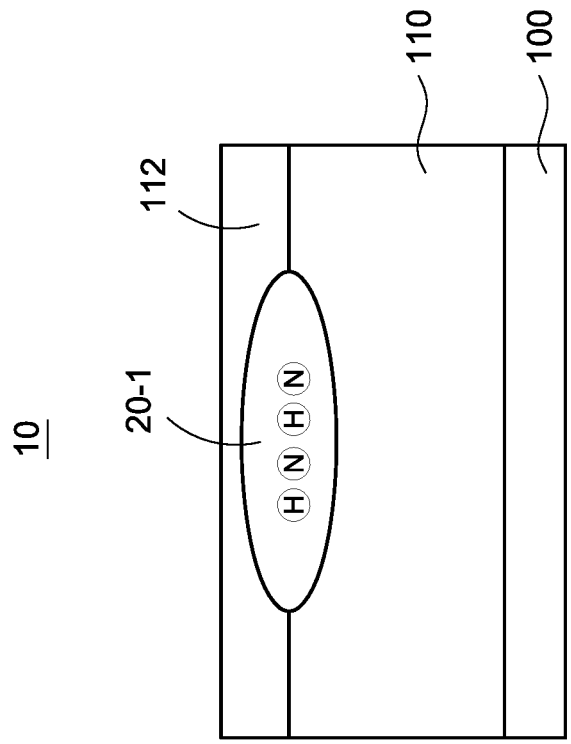
Figure 4:
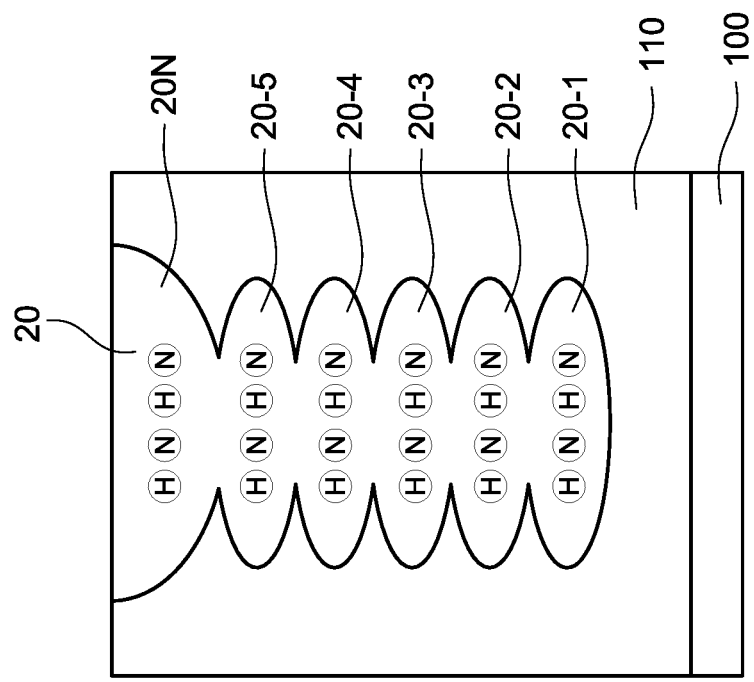

FIGS. 2 to 4 show the process for manufacturing the semiconductor device with super junction according to an embodiment of the present invention. With reference first to FIG. 2, a semiconductor substrate 100 is provided. The semiconductor substrate 100 is for example, a heavily-doped N-type silicon substrate 100 (N+ silicon substrate). Moreover, a lightly-doped N-type epitaxial layer 110 (N− epitaxial layer) is also provided. In the present invention, the conductive type of the substrate is defined as the first conductive type. Therefore, according to above example, the first conductive type is N type doping while the second conductive type is P type doping. However, according to the present invention, the first conductive type may also be P type doping while the second conductive type is correspondingly N type doping.

Figure 6:
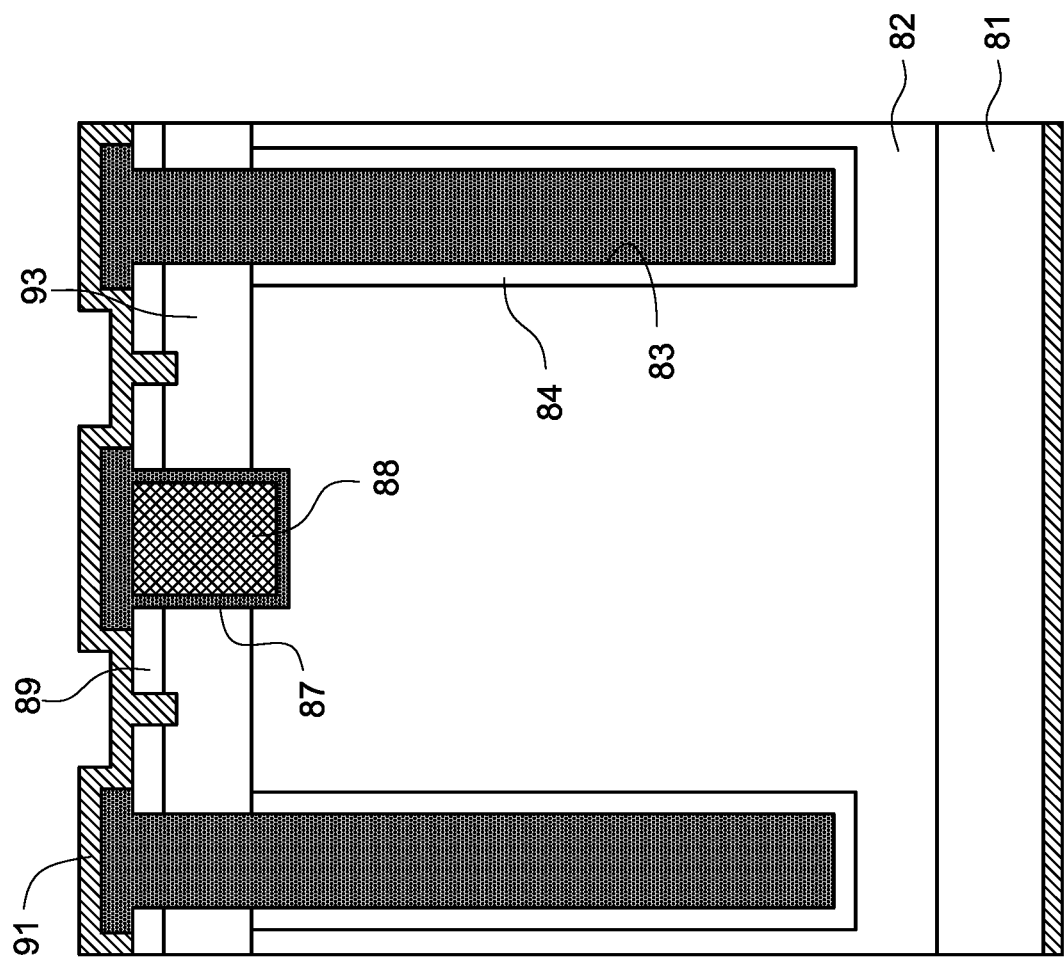
FIG. 6 is a sectional view showing the conventional semiconductor device with super junction.

After preparing the heavily-doped N type silicon substrate 100 and the lightly-doped N type epitaxial layer 110, a mask layer is formed on the resulting structure, where the mask layer is corresponding to the super junction structure, for example, corresponding to the P type layer 84 shown in FIG. 6. According to one possible realization, the mask layer is the photoresist pattern PR shown in FIG. 2. However, any material layer capable of blocking implanted ion during ion implantation process can be used as the mask layer of the present invention. The photoresist pattern PR is formed by photoresist coating, exposure, and development and so on and is arranged on outer side of location corresponding to the super junction structure. More particularly, by coating, exposing and developing the photoresist, pattern corresponding to the photo mask can be transferred to the lightly-doped N type epitaxial layer 110. The coating, exposing and developing of the photoresist are well known arts and the detailed description is not repeated here for brevity.

After forming the photoresist pattern PR, the photoresist pattern PR can be used as a mask and an ion implantation process is conducted for the regions not covered by the photoresist pattern PR. More particularly, the ion implantation process is conducted for the regions of the lightly-doped N-type epitaxial layer 110, which is not covered by the photoresist pattern PR (namely, the exposed portion of the lightly-doped N-type epitaxial layer 110). Because the ion implantation process is conducted for shallow portion of the lightly-doped N type epitaxial layer 110, low energy dose can be used. Moreover, the implanted ion is blocked by the photoresist pattern PR and the region of the lightly-doped N type epitaxial layer 110, which is covered by the photoresist pattern PR, cannot form ion implanted region.

Figure 1:
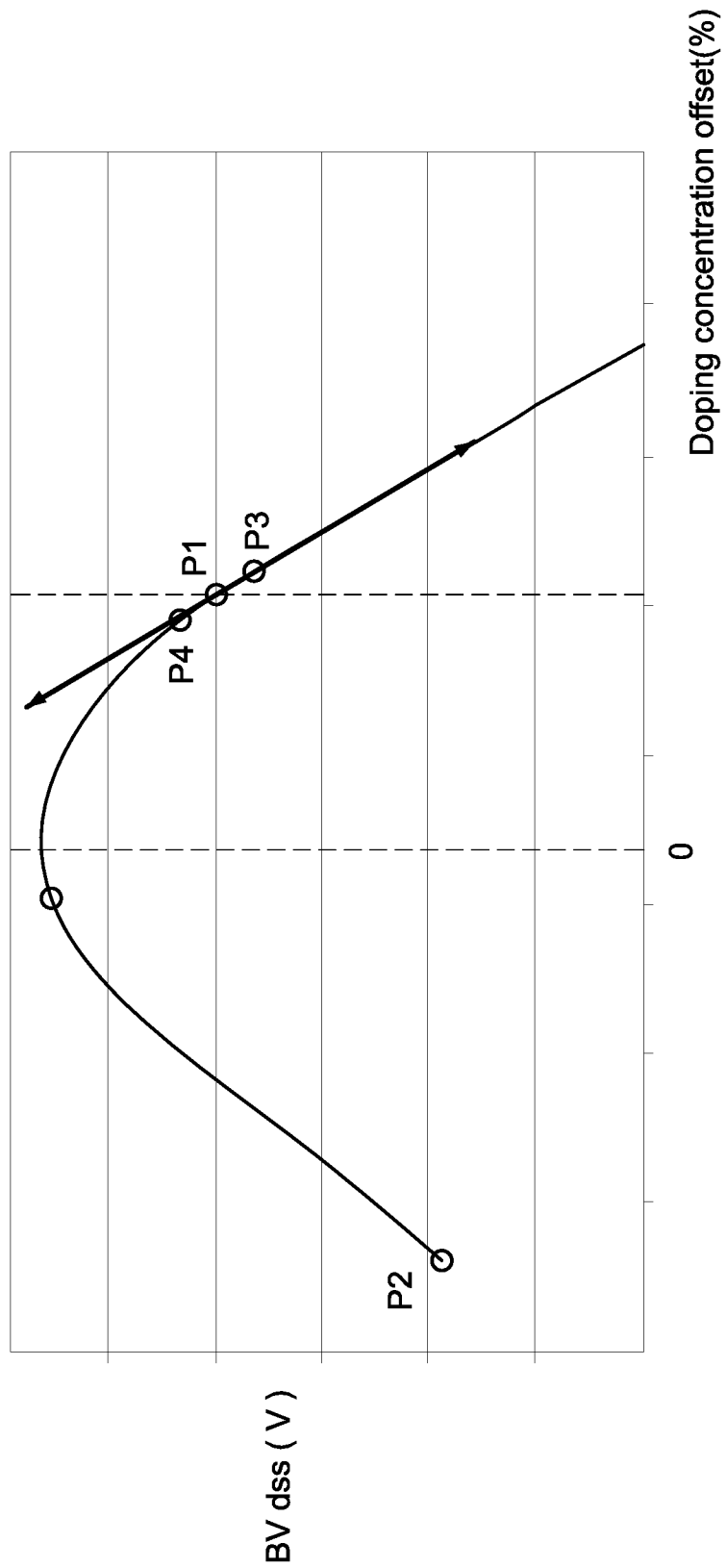
FIG. 1 shows the relationship between the breakdown voltage of the power semiconductor and the doping concentration offset.

In this ion implantation process, neutral element is also implanted besides implanting the P type doping element (for example, group III elements such as boron or gallium). According to one embodiment, the neutral element is noble gas element such as argon (Ar) or neon (Ne). The neutral element does not release (or releases very few) electron or hole in room temperature. When the operating temperature of the super junction device rises or the super junction device is under UIS test for measuring reverse avalanche current, the collision between the boron ion and the neutral element become more frequent to release more holes, thus counteract the released electrons from the lightly-doped N type epitaxial layer 110 due to the rise of temperature, where the P type layer 84 shown in FIG. 6 resides in the lightly-doped N type epitaxial layer 110 (namely, the portion of the lightly-doped N type epitaxial layer 110 accommodating the P type layer 84) and is influenced by the released electrons. More particularly, in the absence of the neutral element, more electrons will be generated in the P type layer 84 as the operating temperature of the super junction device rises or the super junction device is under UIS test such that the operation point of the super junction device moves leftward (toward the point P2) from the original operation point P1 at room temperature, and the surge voltage tolerance of the super junction device becomes inferior. By adding the neutral element with suitable amount, the collisions between the boron ion in the P type layer 84 and the neutral element become more frequent to release more holes, the released holes will counteract with the released electrons from the lightly-doped N type epitaxial layer 110 on which the P type layer 84 resides. Therefore, the operation point of the super junction device has slight movements between points P3 and P4 shown in FIG. 1 even the operating temperature of the super junction device rises or the super junction device is under UIS test.

With reference to FIG. 2, in this ion implantation regions surrounded by the photoresist pattern PR, the P type dopant is represented by symbol H and the neutral element is represented by symbol N. According to one possible implementation of the present invention, in this (the first) ion implementation, the concentration of the neutral element N is proportional to the volume of the trench (such as the trench 83 shown in FIG. 6) in which the neutral element N is placed and proportional to the dopant concentration of the N type dopant in the lightly-doped N type epitaxial layer 110. Therefore, the released holes from the neutral element can counteract or at least partially counteract the additionally released electrons from the lightly-doped N type epitaxial layer 110 on which the P type layer 84 resides due to the rise of operating temperature of the super junction device. Besides, even though the neutral element is exemplified with noble gas element and P type dopant, the scope of the present invention can also be applied to the device with P type substrate, N type layer and certain neutral element, which has neutral polarity in room temperature and releases electrons in high temperature.

With reference to FIG. 3, after the first ion implementation, annealing step can be optionally performed to remove the crystal defect produced during the first ion implementation step. Afterward, the photoresist pattern PR is removed and epitaxial process is performed on the resulting structure to form a silicon epitaxial layer 112 on the resulting structure. The silicon epitaxial layer 112 may have similar material with the underlying lightly-doped N type epitaxial layer 110, namely, the silicon epitaxial layer 112 may also be lightly-doped N-type epitaxial layer. After forming the silicon epitaxial layer 112, similar processes for forming the photoresist pattern PR shown in FIG. 2 are employed to form photoresist pattern similar to that shown in FIG. 2. Namely, by coating, exposing and developing the photoresist, pattern corresponding to the photo mask can be transferred to the silicon epitaxial layer 112. After forming the photoresist pattern on the silicon epitaxial layer 112, the photoresist pattern can be used as a mask and an ion implantation process is conducted for the regions not covered by the photoresist pattern. More particularly, the ion implantation process is conducted for the regions of the silicon epitaxial layer 112 not covered by the photoresist pattern. Similarly, in this ion implantation process, neutral element is also implanted besides implanting the P type doping element (for example, group III elements such as boron or gallium). According to one embodiment, the neutral element is noble gas element such as argon (Ar) or neon (Ne). According to one possible implementation of the present invention, in this (the second) ion implementation, the concentration of the neutral element N is proportional to the volume of the trench (such as the trench 83 shown in FIG. 6) in which the neutral element N is placed and proportional to the dopant concentration of the N type dopant in the lightly-doped N type epitaxial layer 110. Therefore, the released holes from the neutral element can counteract or at least partially counteract the additionally released electrons from the lightly-doped N type epitaxial layer 110 due to the rise of operating temperature of the super junction device.

According to another possible implementation of the present invention, during the first ion implantation, the implantation of the neutral element can be dispensed with. Namely, in the structure corresponding to FIG. 2, only P type dopants H are implanted into the portion not covered by the photoresist pattern PR to form a structure similar to that shown in FIG. 6. Afterward, in the second ion implantation, both P type dopant and neutral element are implanted. Moreover, the concentration (amount) of the neutral element N can be such that the released holes from the neutral element can counteract or at least partially counteract the additionally released electrons from the lightly-doped N type epitaxial layer 110 due to the rise of operating temperature of the super junction device. In other word, it is not necessary to implant the neutral element besides the implantation of the P type dopant in each ion implantation step. In comparison with the conventional process with implantation of only P type dopant, the present invention implants the neutral element (such as Ar) in at least part of the ion implantation steps. Therefore, the released holes from the neutral element can counteract or at least partially counteract the additionally released electrons from the lightly-doped N-type epitaxial layer 110 due to the rise of operating temperature of the super junction device.

As shown in FIG. 4, the processes as shown in FIGS. 2 to 3 are repeated; namely, removing the photoresist pattern PR, forming a silicon epitaxial layer 112 (such as a lightly-doped N type epitaxial layer), forming the photoresist pattern PR to define the region for next ion implantation (namely, the region not blocked by the photoresist pattern PR is the region for implanting ions), performing ion implantation to at least implant P type dopant H (or both the P type dopant H and the neutral element N). By repeating above processes several times and suitable annealing processes, the P type column 20 shown in FIG. 4 can be obtained. Each of the P type columns 20 comprises a plurality of material layers 20-1, 20-2, 20-3 . . . 20-N. Moreover, each of the material layers 20-1, 20-2, 20-3 . . . 20-N has P type dopant H. Besides, at least one of the material layers 20-1, 20-2, 20-3 . . . 20-N has implanted neutral element N, for example, noble gas element such as argon (Ar) or neon (Ne). By the adding of the neutral element N, the released holes from the neutral element can counteract or at least partially counteract the additionally released electrons from the lightly-doped N type epitaxial layer 110 (on which the P type dopant resides) due to the rise of operating temperature of the super junction device. Moreover, according to another possible implementation, each of the material layers 20-1, 20-2, 20-3 . . . 20-N is implanted with the neutral element N. Similarly, in this situation, the released holes from the neutral element can counteract or at least partially counteract the additionally released electrons from the lightly-doped N type epitaxial layer 110 (on which the P type dopant resides) due to the rise of operating temperature of the super junction device.

Figure 5:
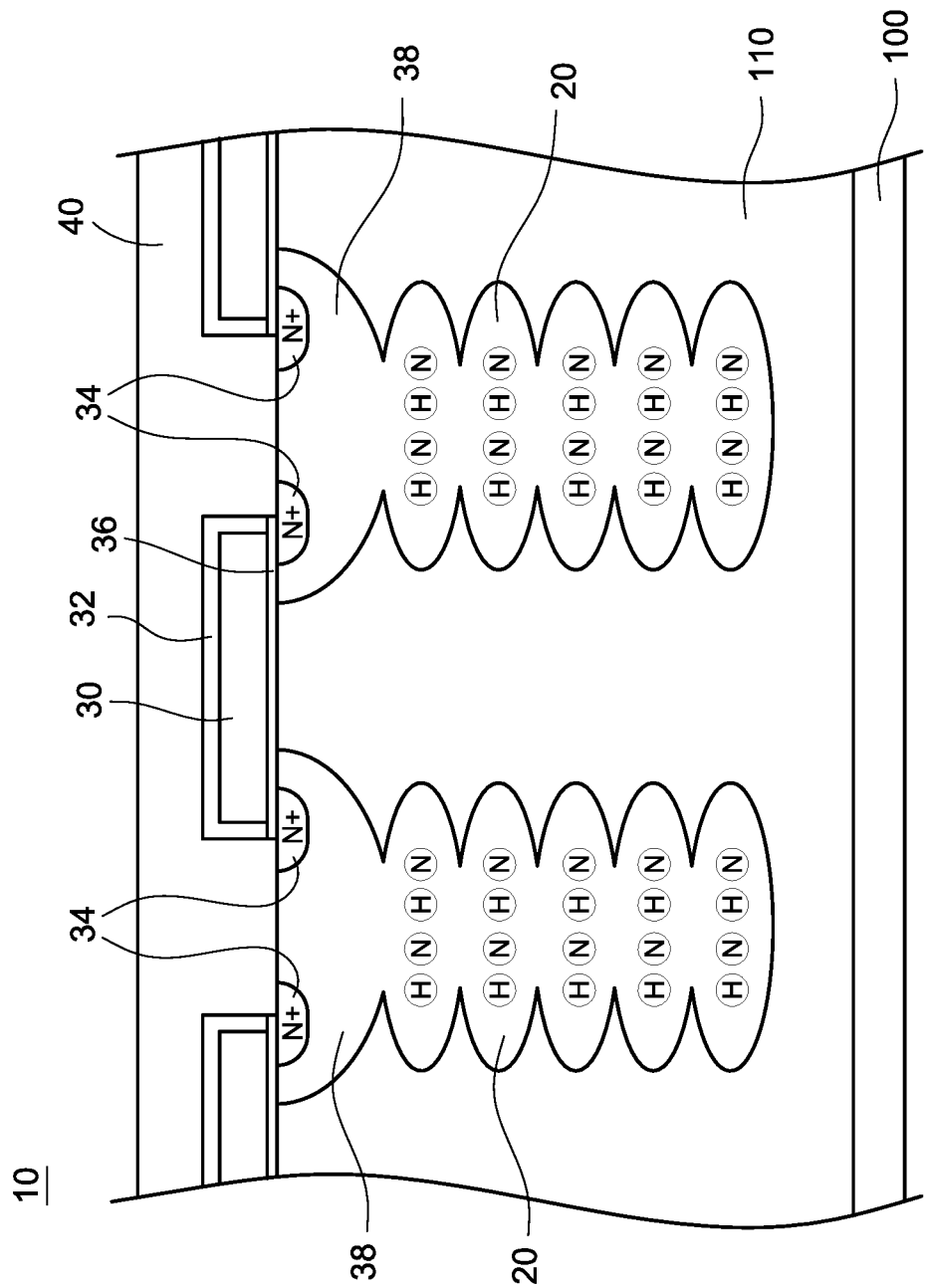
FIG. 5 is a sectional view showing the semiconductor device with super junction of the present invention.

As shown in FIG. 5, after forming the P type columns 20, additional processes are performed to form the P body 38, the N+ doping region 34, the gate electrode 30, the gate oxide layer 36, the gate insulation layer 32 and the source electrode 40 to complete the semiconductor device 10 with super junction according to the present invention. These additional processes are conventional arts and the detailed description is omitted here. The semiconductor device 10 with super junction can be for example, super junction MOSFET, super junction MESFET, super junction Schottky transistor, super junction IGBT, or super junction diode.

With reference back to FIG. 1, in the semiconductor device 10 with super junction according to the present invention, at least one of the P type columns 20 is implanted with the neutral element N. The concentration of the neutral element N is, for example, proportional to the volume of the trench (such as the trench 83 shown in FIG. 6) in which the neutral element N is placed and/or proportional to the dopant concentration of the N type dopant in the lightly-doped N type epitaxial layer 110. In this situation, the released holes from the neutral element N can counteract or at least partially counteract the additionally released electrons from the lightly-doped N type epitaxial layer 110 (in which the P type dopant resides) due to the rise of operating temperature of the super junction device. Therefore, in the semiconductor device 10 with super junction according to the present invention, the operation point can be kept around the point P1 even though the operating temperature of the super junction device rises. On the contrary, in the super junction device without implanting the neutral element N, the operation point will move leftward to the point P2 when the operating temperature of the super junction device rises because the lightly-doped N type epitaxial layer 110 will release more electrons. As a result, the tolerance for the surge voltage is inferior.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A process for manufacturing semiconductor device with super junction, the process comprising:
    (a) providing a silicon substrate;
    (b) forming a first conductive type epitaxial layer on the silicon substrate;
    (c) forming a mask layer on the first conductive type epitaxial layer;
    (d) implanting a second conductive type ions and neutral elements in a part of the first conductive type epitaxial layer not covered by the mask layer;
    (e) removing the mask layer;
    (f) repeating the steps (b) to (e) for a predetermined time to form a plurality of first conductive type epitaxial layers, wherein the first conductive type epitaxial layers have second conductive type ions and neutral elements;
    wherein in the step (d), the second conductive type ions and neutral elements are implanted in the same implantation process.

2. The process for manufacturing semiconductor device with super junction in claim 1, wherein the mask layer is photoresist layer.

3. The process for manufacturing semiconductor device with super junction in claim 1, wherein the first conductive type is N type and the second conductive type is P type.

4. The process for manufacturing semiconductor device with super junction in claim 3, wherein the second conductive type ions are boron or gallium.

5. The process for manufacturing semiconductor device with super junction in claim 3, wherein the neutral elements are noble gases.

6. The process for manufacturing semiconductor device with super junction in claim 5, wherein the noble gases are argons.

7. The process for manufacturing semiconductor device with super junction in claim 1, wherein a concentration of neutral elements is proportion to a doping concentration of the first conductive type epitaxial layer.

\* \* \* \* \*